(12) United States Patent
Wu et al.

(10) Patent No.: US 11,955,379 B2
(45) Date of Patent: Apr. 9, 2024

(54) METAL ADHESION LAYER TO PROMOTE METAL PLUG ADHESION

(71) Applicant: Taiwan Semiconductor Manufacturing Company Limited, Hsinchu (TW)

(72) Inventors: Pei-Wen Wu, Hsinchu County (TW); Chun-I Tsai, Hsinchu (TW); Chi-Cheng Hung, Tainan (TW); Jyh-Cherng Sheu, Hsinchu (TW); Yu-Sheng Wang, Tainan (TW); Ming-Hsing Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 481 days.

(21) Appl. No.: 17/021,776

(22) Filed: Sep. 15, 2020

(65) Prior Publication Data
US 2022/0084879 A1 Mar. 17, 2022

(51) Int. Cl.
*H01L 21/768* (2006.01)
*H01L 21/285* (2006.01)
*H01L 29/45* (2006.01)

(52) U.S. Cl.
CPC .. *H01L 21/76846* (2013.01); *H01L 21/28562* (2013.01); *H01L 21/76856* (2013.01); *H01L 21/76897* (2013.01); *H01L 29/456* (2013.01)

(58) Field of Classification Search
CPC .............. H01L 21/76858; H01L 21/76856
See application file for complete search history.

(56) References Cited

U.S. PATENT DOCUMENTS

| | | | | |
|---|---|---|---|---|
| 5,627,102 A * | 5/1997 | Shinriki | ............ | H01L 21/32136 257/E21.582 |
| 6,344,411 B1 * | 2/2002 | Yamada | ............ | H01L 21/76864 438/653 |
| 6,911,391 B2 * | 6/2005 | Yang | ........................ | C23C 16/42 438/653 |
| 7,311,946 B2 * | 12/2007 | Garg | ................. | H01L 21/76843 427/249.17 |
| 10,079,210 B2 * | 9/2018 | Lee | .................... | H01L 23/53209 |
| 10,755,917 B2 * | 8/2020 | Chen | ................. | H01L 21/76856 |
| 2020/0006055 A1 * | 1/2020 | Chen | ................. | H01L 21/76897 |
| 2021/0351071 A1 * | 11/2021 | Liu | .................... | C23C 16/45553 |

* cited by examiner

*Primary Examiner* — Daniel Luke
(74) *Attorney, Agent, or Firm* — Harrity & Harrity, LLP

(57) ABSTRACT

A metal adhesion layer may be formed on a bottom and a sidewall of a trench prior to formation of a metal plug in the trench. A plasma may be used to modify the phase composition of the metal adhesion layer to increase adhesion between the metal adhesion layer and the metal plug. In particular, the plasma may cause a shift or transformation of the phase composition of the metal adhesion layer to cause the metal adhesion layer to be composed of a (111) dominant phase. The (111) dominant phase of the metal adhesion layer increases adhesion between the metal adhesion layer.

21 Claims, 13 Drawing Sheets

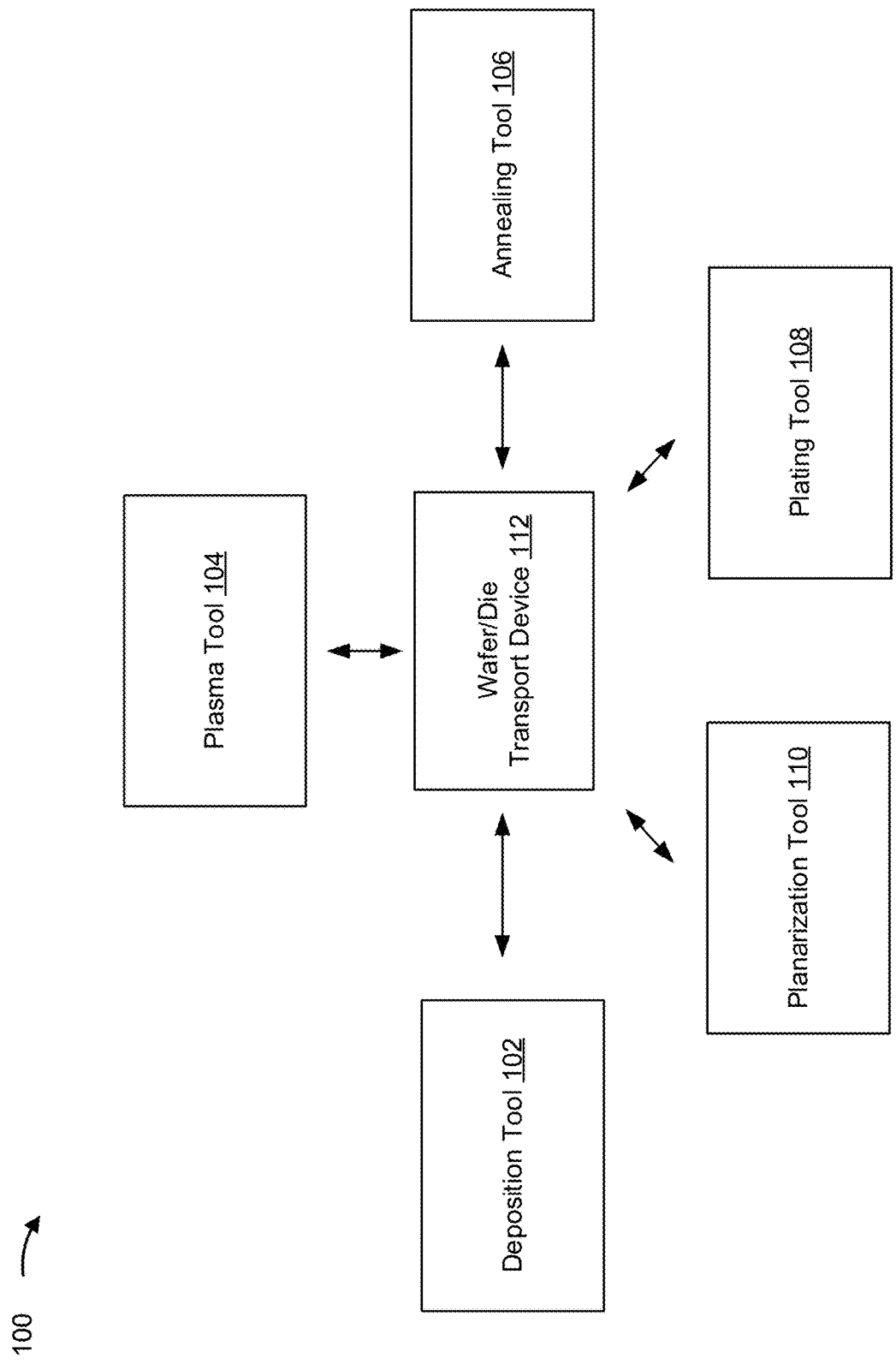

METAL ADHESION LAYER TO PROMOTE METAL PLUG ADHESION

BACKGROUND

Metal plugs may be used as contact vias to connect various portions of a semiconductor device (e.g., a source/drain region or epitaxial region, a gate, etc.) to back end of the line (BEOL) metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of an example environment in which systems and/or methods described herein may be implemented.

DETAILED DESCRIPTION

Figure 2A:
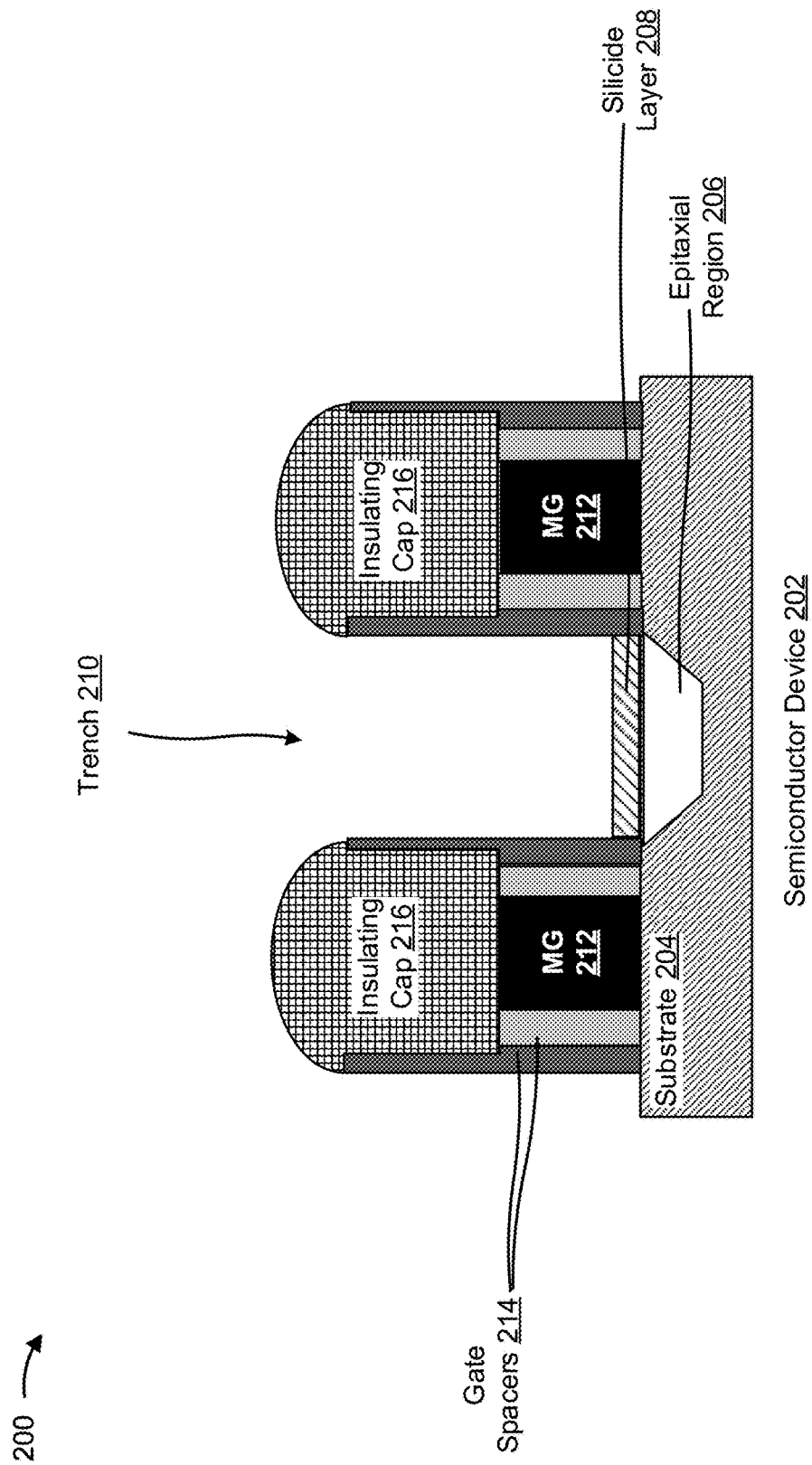
FIGS. 2A-2H are diagrams of one or more example implementations described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To reduce contact resistance between a metal plug and an epitaxial region, a titanium silicide (TiSi) layer may be formed at the bottom of the trench in which the metal plug is to be filled. A titanium silicon nitride (TiSiN) coating (e.g., 2 nanometers) may be used as a metal glue layer to improve adhesion of the metal plug (e.g., cobalt (Co)) to the TiSi layer and to the silicon nitride (SiN) sidewalls of the trench.

However, the TiSiN may suffer from de-wetting from the metal plug. In particular, non-uniform nucleation and uneven coverage of the TiSiN coating may result in poor adhesion with the metal plug and continuity degradation of the TiSiN coating. The poor adhesion and continuity degradation of the TiSiN coating results in voids between the sidewalls of the trench and the metal plug, and results in voids between the bottom layer of the trench and the metal plug. These voids may increase contact resistance of the metal plug, which may decrease the performance of a semiconductor device in which the metal plug is included.

Some implementations described herein provide a thin (e.g., 1-3 nanometers) metal adhesion layer to reduce de-wetting from a metal plug. The metal adhesion layer may be formed on a bottom and a sidewall of a trench (e.g., with or without an intervening TiSiNi layer) prior to formation of the metal plug in the trench. A nitrogen-based plasma may be used to modify the phase composition of the metal adhesion layer to increase adhesion between the metal adhesion layer and the metal plug. In particular, the nitrogen-based plasma may cause a shift or transformation of the phase composition of the metal adhesion layer from being roughly equally composed of a (111) phase and a (200) phase (or from having less of a (111) phase component than a (200) phase component), to being composed of a (111) dominant phase. As an example, the resulting phase composition of the metal adhesion layer may have a (111) dominant phase in that a ratio between the (111) phase and the (200) phase is between 3:1 and 6:1 or greater.

The (111) dominant phase of the metal adhesion layer increases adhesion between the metal adhesion layer and the metal plug in that the (111) dominant phase results in a finer-grained micro structure of the metal adhesion layer relative to the (200) phase, results in a crystal structure for the metal adhesion layer that has a higher interfacial nitrogen density relative to the (200) phase, and/or the like. The finer-grained micro structure and the higher interfacial nitrogen density provides a greater quantity of nitrogen atoms to which the metal plug may bond, thereby increasing adhesion between the metal adhesion layer and the metal plug. The increased adhesion between the metal adhesion layer and the metal plug may reduce voids, recesses, and other types of defects in the metal plug, may reduce defects in subsequent processes, and may increase semiconductor manufacturing yields without increasing the complexity of the forming the metal plug.

FIG. 1 is a diagram of an example environment 100 in which systems and/or methods described herein may be implemented. As shown in FIG. 1, environment 100 may include a deposition tool 102, a plasma tool 104, an annealing tool 106, a plating tool 108, a planarization tool 110, and a wafer/die transport device 112. The tools and/or devices included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a semiconductor device. In some implementations, the deposition tool 102 includes a chemical vapor deposition (CVD) tool, such as an atomic layer deposition (ALD) tool, an epitaxy tool, a metal organic CVD (MOCVD) tool, a plasma-enhanced CVD (PECVD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The plasma tool 104 may include a plasma source that capable of generating a plasma. For example, the plasma tool 104 includes an inductively coupled plasma (ICP) source, a transformer coupled plasma (TCP) source, or another type of plasma source capable of generating an isotropic plasma, an anisotropic plasma, a partially isotropic plasma, or another type of plasma. In some implementations, the plasma tool 104 may generate a plasma including an ionized gas that may be used for various semiconductor processes describe herein.

The annealing tool 106 is a semiconductor processing tool that includes a semiconductor processing chamber and one or more devices capable of heating a semiconductor device. For example, the annealing tool 106 may include a rapid thermal anneal (RTA) tool, a rapid thermal processing (RTP) tool, or another type of annealing tool that is capable of heating a semiconductor device to cause a reaction between two or more materials or gasses, to cause a material to decompose, and/or the like. For example, the annealing tool 106 may heat a semiconductor device to cause a metal layer on an epitaxial region (e.g., a source region or a drain region) to react and form a metal silicide layer, as described herein.

Plating tool 108 is a semiconductor processing tool that includes a semiconductor processing chamber and one or more devices capable of plating a semiconductor device with one or more metals. Plating, and particularly electroplating (or electro-chemical deposition), is a process by which conductive structures are formed on a substrate (e.g., a semiconductor wafer, a semiconductor device, and/or the like). Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material ions into trenches, vias, interconnects, and/or other structures in and/or on the substrate. In some implementations, plating tool 108 may include a copper electroplating tool, a cobalt electroplating tool, an aluminum electroplating tool, a nickel electroplating tool, a titanium electroplating tool, a tin electroplating tool, a compound material or alloy (e.g., tin-silver, tin-lead, and/or the like) electroplating tool, and/or an electroplating tool for one or more other types of conductive materials, metals, and/or the like. In some implementations, plating tool 108 may form a metal plug in a trench, as described herein.

The planarization tool 110 is a semiconductor processing tool that is capable of polishing and/or planarizing one or more layers of a semiconductor device to increase the flatness of the layers of the semiconductor device, to improve layer stacking for the semiconductor device, and/or the like. The planarization tool 110 may polish and/or planarize a layer, a substrate, or a wafer using a polishing or planarizing technique such as chemical mechanical polishing/planarization (CMP). A CMP process may include depositing a slurry (or polishing compound) onto a polishing pad. A wafer may be mounted to a carrier, which may rotate the wafer as the wafer is pressed against the polishing pad. The slurry and polishing pad act as an abrasive that polishes or planarizes one or more layers of the wafer as the wafer is rotated. The polishing pad may also be rotated to ensure a continuous supply of slurry is applied to the polishing pad.

Wafer/die transport device 112 includes a mobile robot, a robot arm, a tram or rail car, and/or another type of device that are used to transport wafers and/or dies between semiconductor processing devices 102-110 and/or to and from other locations, such as a wafer rack, a storage room, and/or the like. In some implementations, wafer/die transport device 112 may be a programmed device to travel a particular path and/or may operate semi-autonomously.

The number and arrangement of devices and networks shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2A-2H are diagrams of one or more example implementations 200 described herein. Example implementation(s) 200 may include one or more example implementations of forming one or more parts of a semiconductor device 202. The semiconductor device 202 may include a transistor (e.g., a metal oxide field effect transistor (MOSFET) or another type of transistor), a memory device (e.g., a static random access memory (SRAM) or another type of memory device), and/or the like.

As shown in FIG. 2A, the semiconductor device 202 may include various types of semiconductor structures, including a substrate 204 in which an epitaxial region 206 may be formed, an optional silicide layer 208 above and/or on the epitaxial region 206 in a trench 210 formed by a plurality of gate spacers 214 that electrically isolate the trench 210 and metal gates 212 formed on each side of the trench 210, insulating caps 216 formed on the metal gates 212 to permit a self-aligned contact (SAC) or self-aligned metal plug to be formed in the trench 210, and/or other semiconductor structures.

The substrate 204 may include an active region of a transistor, a shallow trench isolation (STI) structure, or another type of substrate 204. In some implementations, the substrate 204 is a silicon wafer or a portion thereof. In some implementations, the substrate 204 is a layer of silicon or poly-silicon formed on a wafer or a portion thereof. The epitaxial region 206 may include a source region or a drain region of the semiconductor device. The epitaxial region 206 may be formed in the substrate 204 (e.g., by deposition tool 102) through epitaxial growth.

Silicide layer 208 may include a layer of a metal silicide such as a titanium silicide ($TiSi_x$), a nickel silicide ($Ni_xSi$), or another metal silicide, that is to reduce contact resistance between the epitaxial region 206 and a metal plug to be formed in trench 210. In some implementations, the silicide layer 208 may be formed by depositing (e.g., using deposition tool 102) a metal layer or a metal silicide layer on the epitaxial region 206. In some implementations, the metal layer or a metal silicide layer is deposited on both sidewalls and bottom of the trench 210 using a CVD technique, and then portions of the metal layer on sidewalls of the trench 210 are optionally removed. In some implementations, the metal layer or a metal silicide layer is deposited on sidewalls of the trench 210 using a PVD technique. An anneal of the semiconductor device 202 may be performed (e.g., using annealing tool 106) to heat the semiconductor device 202.

The metal layer may include a titanium layer, a tungsten layer, a nickel layer, a ruthenium layer, a molybdenum layer, or another type of metal. The elevated temperature, caused by heating the semiconductor device 202, causes the metal layer to react with the epitaxial region 206. The reaction causes the metal layer and silicon in the epitaxial region 206 to form the self-aligned silicide layer 208 on the epitaxial region 206 in the trench 210.

The trench 210 may be a narrow trench with a high aspect ratio or another type of trench. The gate spacers 214 may include an electrically insulating material, such as silicon oxide ($SiO_x$), silicate glass, silicon oxycarbide, silicon nitride ($Si_xN_y$), and/or the like. The gate spacers 214 may function as a sidewall of the trench 210 in addition to providing electrical insulation for the metal gates 212. The metal gates 212 may include an electrically conductive metal, such as titanium, cobalt, tungsten, aluminum, copper, ruthenium, iridium, and/or the like. In examples in which an SAC is to be formed in the trench 210, a portion of the metal gates 212 may be etched (e.g., using a dry etching process, a wet etching process, and/or the like) such that insulating caps 216 may be formed over each of the metal gates 212 to electrically insulate the top and/or portions of the side of the metal gates 212 from the SAC. The insulating cap 216 may be formed of an electrically insulating material, such as silicon oxide ($SiO_x$), silicate glass, silicon oxycarbide, silicon nitride ($Si_xN_y$), and/or the like.

Figure 2B:
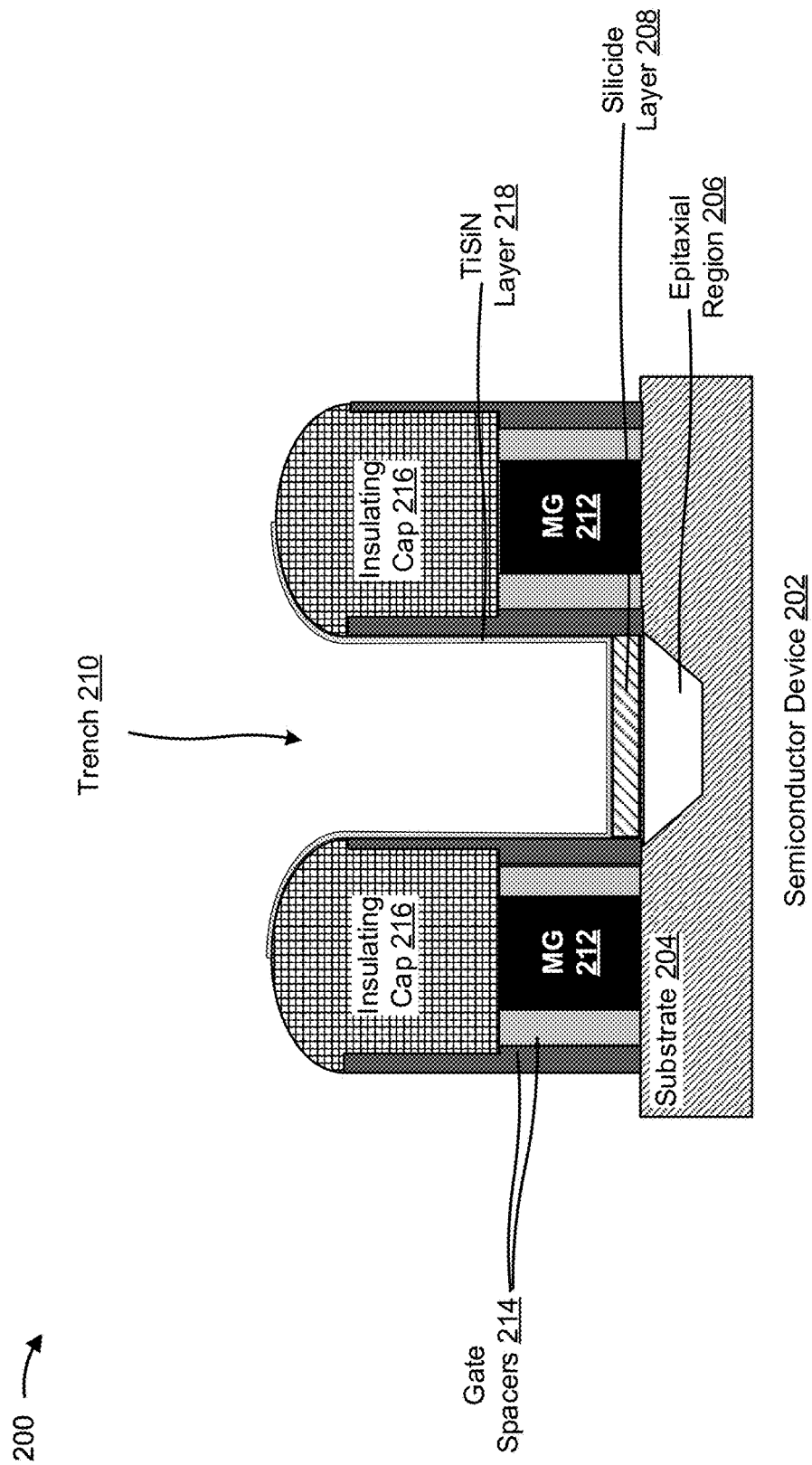

As shown in FIGS. 2B-2F, one or more processes and/or techniques may be performed on the semiconductor device 202 to prepare the trench 210 to be filled with a metal plug, a contact, or an SAC. As shown in FIG. 2B, a titanium silicon nitride (TiSiN) layer 218 may be formed on the bottom and on the sidewall of the trench 210. In some implementations, the TiSiN layer 218 may be formed to a thickness in a range of approximately 2 nanometers to approximately 2.5 nanometers in some areas of the trench 210 and/or to a thickness in a range of approximately 1 nanometer to approximately 1.5 nanometers in examples where the silicide layer 208 is formed using a CVD process. In some implementations, the TiSiN layer 218 may be formed to a thickness in a range of approximately 2 nanometers to approximately 4 nanometers in some areas of the trench 210 and/or to a thickness in a range of approximately 0.5 nanometer to approximately 1.5 nanometers in examples where the silicide layer 208 is formed using a PVD process. In some implementations, a semiconductor processing tool (e.g., deposition tool 102) may form the TiSiN layer 218 by a CVD process, a PVD process, an ALD process, or another type of deposition process. In some implementations, a TiSiN layer 218 is omitted and is not used in the process of filling trench 210.

Figure 2C:
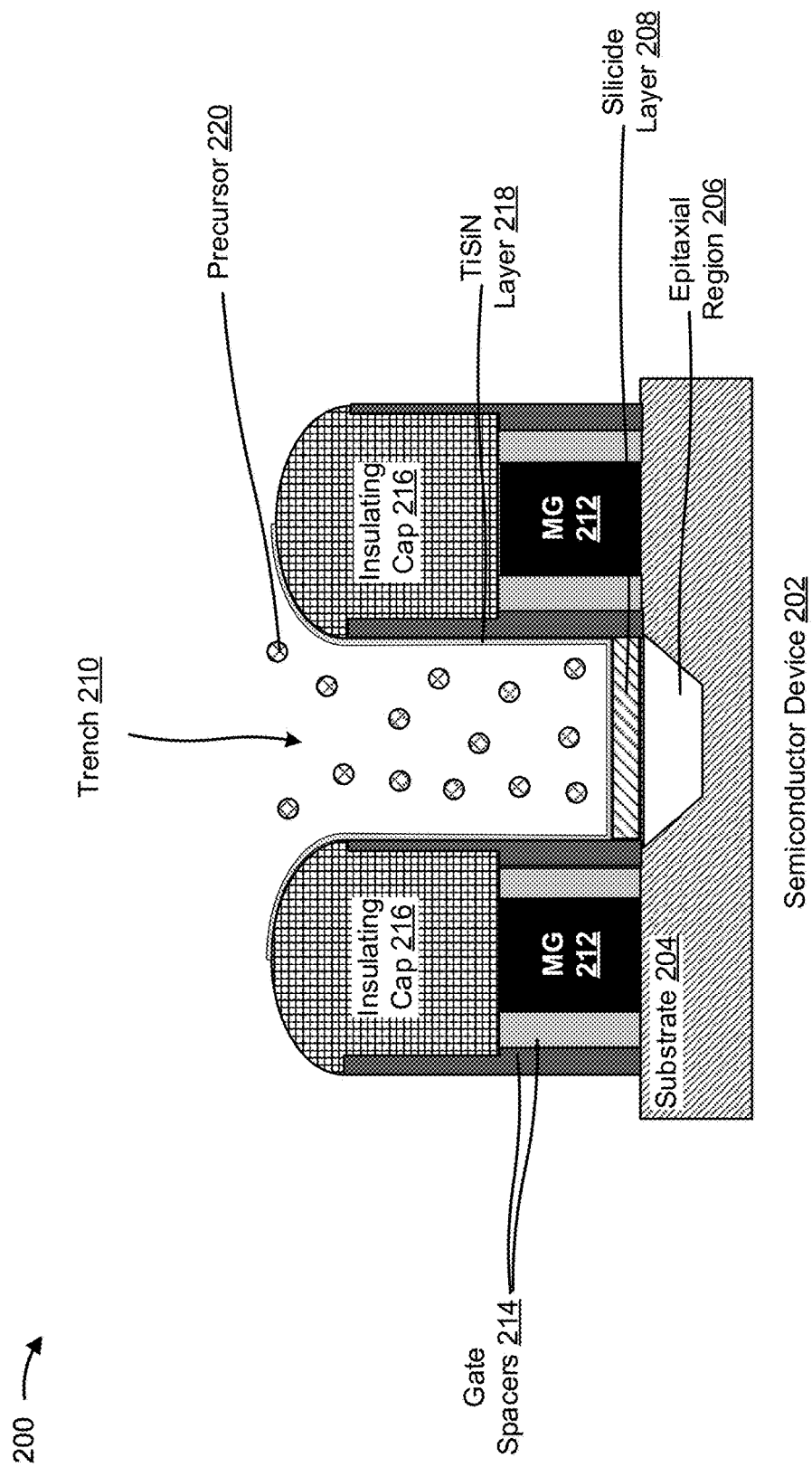

As shown in FIG. 2C, a precursor 220 may be used as a pre-deposition treatment of the TiSiN layer 218 to prepare the TiSiN layer 218 for formation of a metal adhesion layer on the TiSiN layer 218. For example, the precursor 220 may be provided to a processing chamber in which the semiconductor device 202 is included, and may be deposited onto the TiSiN layer 218. The precursor 220 may include a gas, such as tetrakis(dimethylamino)titanium (TDMAT or $C_8H_{24}N_4Ti$), that is used as a titanium dioxide ($TiO_2$) precursor for atomic layer deposition of titanium nitride ($TiN_x$) or another type of gas that is used as a precursor for deposition of another type of metal adhesion layer.

Figure 2D:
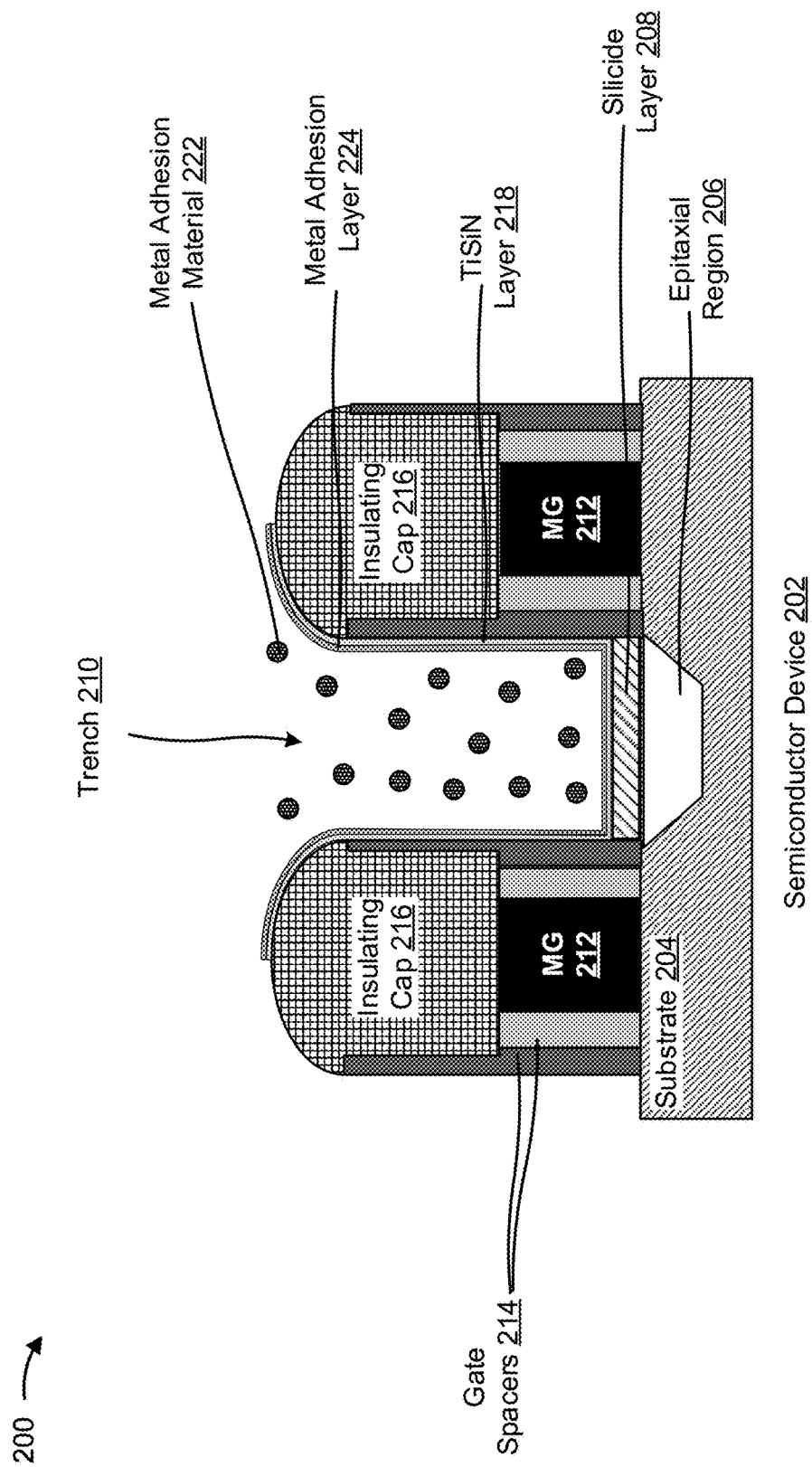

As shown in FIG. 2D, a metal adhesion material 222 may be provided to the processing chamber to react with the precursor 220 to form a metal adhesion layer 224 on the bottom of the trench 210 and on the side wall of the trench 210 (e.g., on and/or over the silicide layer 208 and/or the TiSiN layer 218). The metal adhesion material 222, and the metal adhesion layer 224 by extension, may include titanium nitride ($TiN_x$), tantalum nitride ($Ta_xN_y$), tungsten nitride ($WN_x$), ruthenium, ruthenium cobalt (RuCo), or another material.

In some implementations, a semiconductor processing tool (e.g., deposition tool 102) may deposit the metal adhesion material 222 to form the metal adhesion layer 224 by a CVD technique such as atomic layer deposition. Forming the metal adhesion layer 224 through the use of atomic layer deposition allows for a thin layer of the metal adhesion material 222 to be deposited in a highly controlled manner. This enables the metal adhesion layer 224 to be formed to a thickness in a range from approximately 1 nanometer to approximately 3.5 nanometers on the bottom and the sidewall of the trench 210.

Figure 2E:
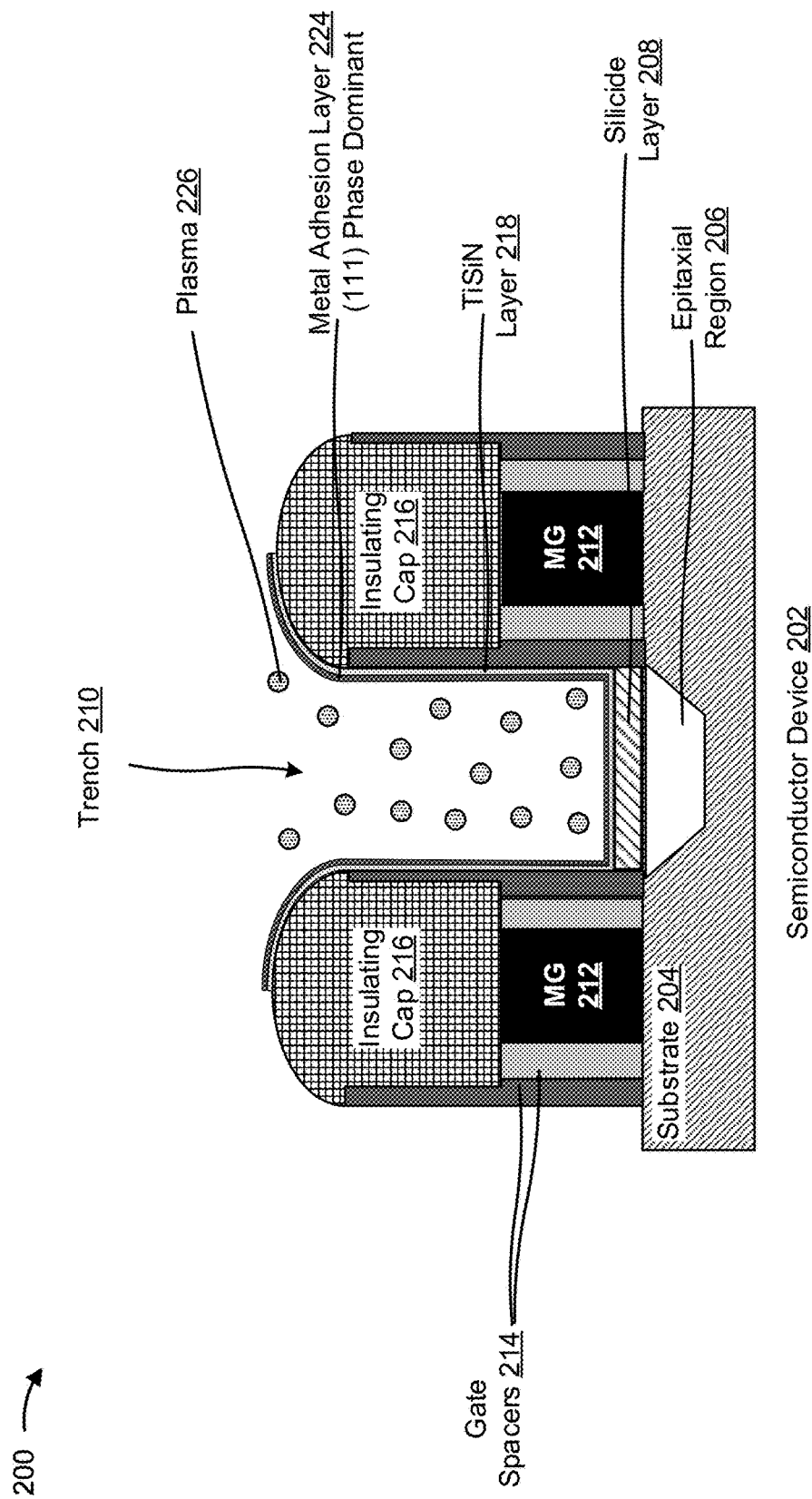

As shown in FIG. 2E, a semiconductor processing tool (e.g., plasma tool 104) may provide a plasma 226 into a processing chamber. The plasma 226 may be a nitrogen-based plasma (e.g., a plasma including $N_2$ ions) that reacts with the metal adhesion layer 224. The semiconductor processing tool may provide a flow-in of nitrogen gas, for example, at a rate in a range from approximately 2000 standard cubic centimeters per minute (SCCM) to approximately 5500 SCCM. A plasma source in a range of approximately 3000 watts to approximately 5000 watts may generate the plasma 226 from the nitrogen gas in the processing chamber at a pressure in a range of approximately 0.5 torr to approximately 2.5 torr and a temperature in a range of approximately 250 degrees Celsius to approximately 400 degrees Celsius.

The plasma 226 may be used as a treatment for the metal adhesion layer 224 to increase the adhesion between the metal adhesion layer 224 and a metal plug to be filled in the trench 210. In particular, the plasma 226 may react with the metal adhesion layer 224 to cause a phase composition change or transformation (also referred to as a crystal plane orientation change or transformation) for the metal adhesion layer 224. As an example, if the metal adhesion layer 224 is a titanium nitride layer and the plasma 226 is a nitrogen-based plasma, the nitrogen ions in the plasma may react with the titanium nitride to cause a (111) phase of the titanium nitride to become a dominant phase of the phase composition of the titanium nitride. In this way, the plasma 226 causes an increase in the (111) phase of the titanium nitride and/or a decrease in a (200) phase of the titanium nitride. Thus, if the phase composition of the titanium nitride is dominated by the (200) phase (or if the phase composition is approximately equal composition of the (111) phase and the (200) phase), the treatment with the plasma 226 may increase the (111) phase to a ratio between the (111) phase and the (200) phase in a range of approximately 3:1 to approximately 6:1 or greater in the phase composition.

The increase of the (111) phase in the phase composition of the metal adhesion layer 224 (and/or the decrease of the (200) phase) increases adhesion with a metal plug that is to be filled in the trench 210 by modifying one or more properties of the metal adhesion layer 224. For example, the increase of (111) phase (and/or the decrease of the (200) phase) may cause the nucleation (e.g., the initiation of a new thermodynamic phase or structure) of the metal adhesion layer 224 to be more uniform relative to the TiSiN layer 218, which increases the continuity of the metal adhesion layer 224 relative to the TiSiN layer 218. Moreover, the nitrogen ions from the plasma 226 treatment diffuse into the metal adhesion layer 224 to cause the change in phase composition of the metal adhesion layer 224 to be (111) phase dominant. These nitrogen ions are inserted into the crystal lattice structure of the metal adhesion layer 224, which increases the interfacial nitrogen density of the crystal lattice structure. The increased interfacial nitrogen density provides an increased quantity of nitrogen ions to which the metal plug can bond, thereby increasing adhesion between the metal adhesion layer 224 and the metal plug.

In some implementations, the processes and/or techniques described above in connection with FIGS. 2C-2E may be performed for a plurality of cycles (e.g., 3 cycles, 6 cycles, or another quantity of cycles) to form and treat the metal adhesion layer 224. In these examples, a first layer of the metal adhesion layer 224 may be formed (e.g., the precursor 220 may be deposited, and the metal adhesion material 222 may be deposited to react with the precursor 220 to form the first layer) and treated with the plasma 226 such that the (111) phase is dominant for the first layer, a second layer of the metal adhesion layer 224 may be formed on the first layer (e.g., the precursor 220 may be deposited, and the metal adhesion material 222 may be deposited to react with the precursor 220 to form the second layer) and treated with the plasma 226 such that the (111) phase is dominant for the second layer, and so on for additional layers until the metal adhesion layer 224 is formed to a particular thickness.

Figure 2F:
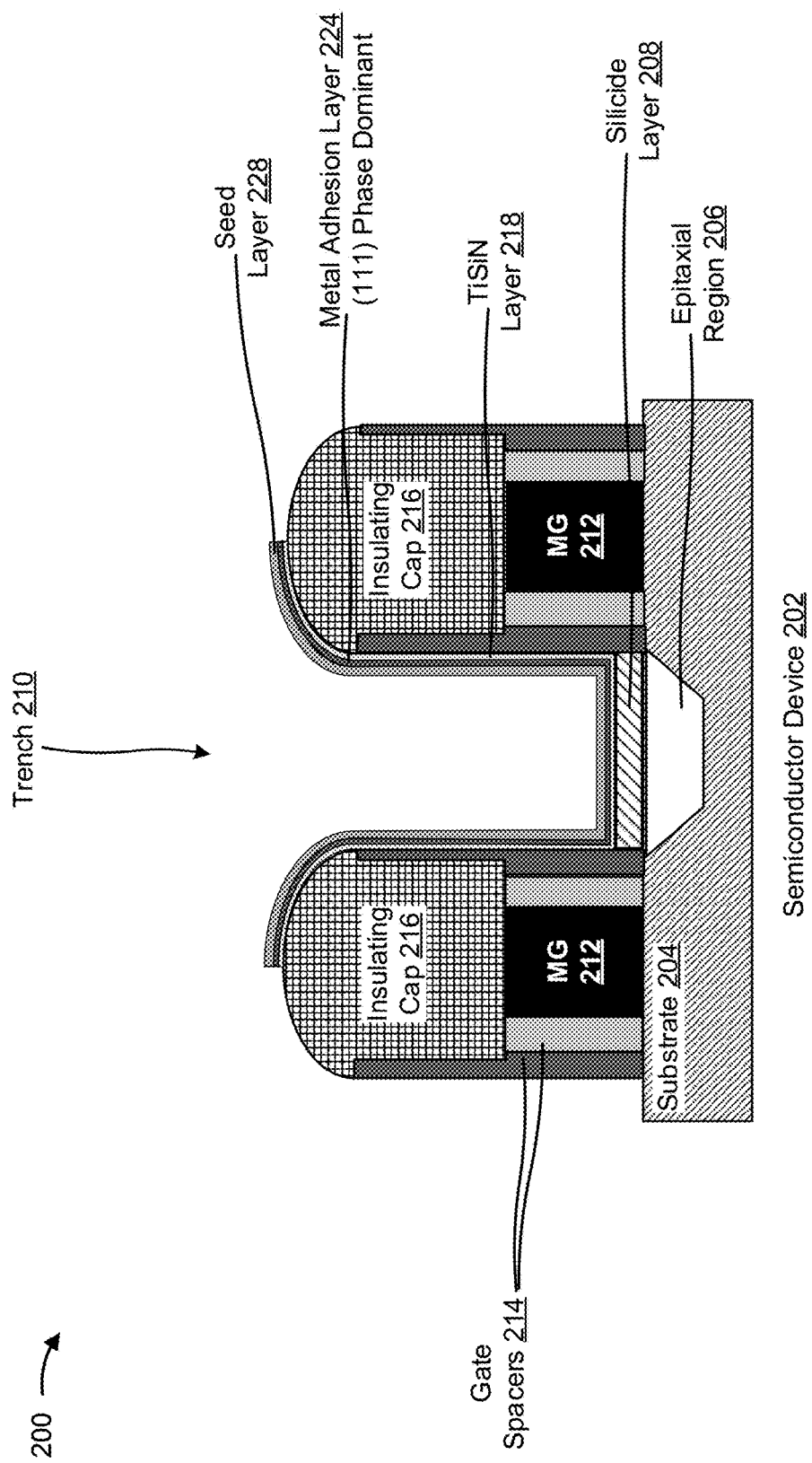

As shown in FIG. 2F, once the metal adhesion layer 224 is formed, a seed layer 228 may be formed on and/or over the metal adhesion layer 224 in the trench 210. The seed layer 228 may be an initial metal layer that is formed in the trench 210 to initiate the formation of the metal plug in the trench 210. The seed layer 228 may be formed of the same material of the metal plug or of a different material. Examples of materials used for the seed layer 228 include titanium, cobalt, tantalum, tungsten, aluminum, hafnium, ruthenium, zirconium, molybdenum, and/or the like. In some implementations, a semiconductor processing tool (e.g., deposition tool 102, plating tool 108, or another processing tool) may deposit or form the seed layer 228 on and/or over the metal adhesion layer 224, over the TiSiN layer 218, over the bottom and the sidewall of the trench 210, and/or the like.

Figure 2G:
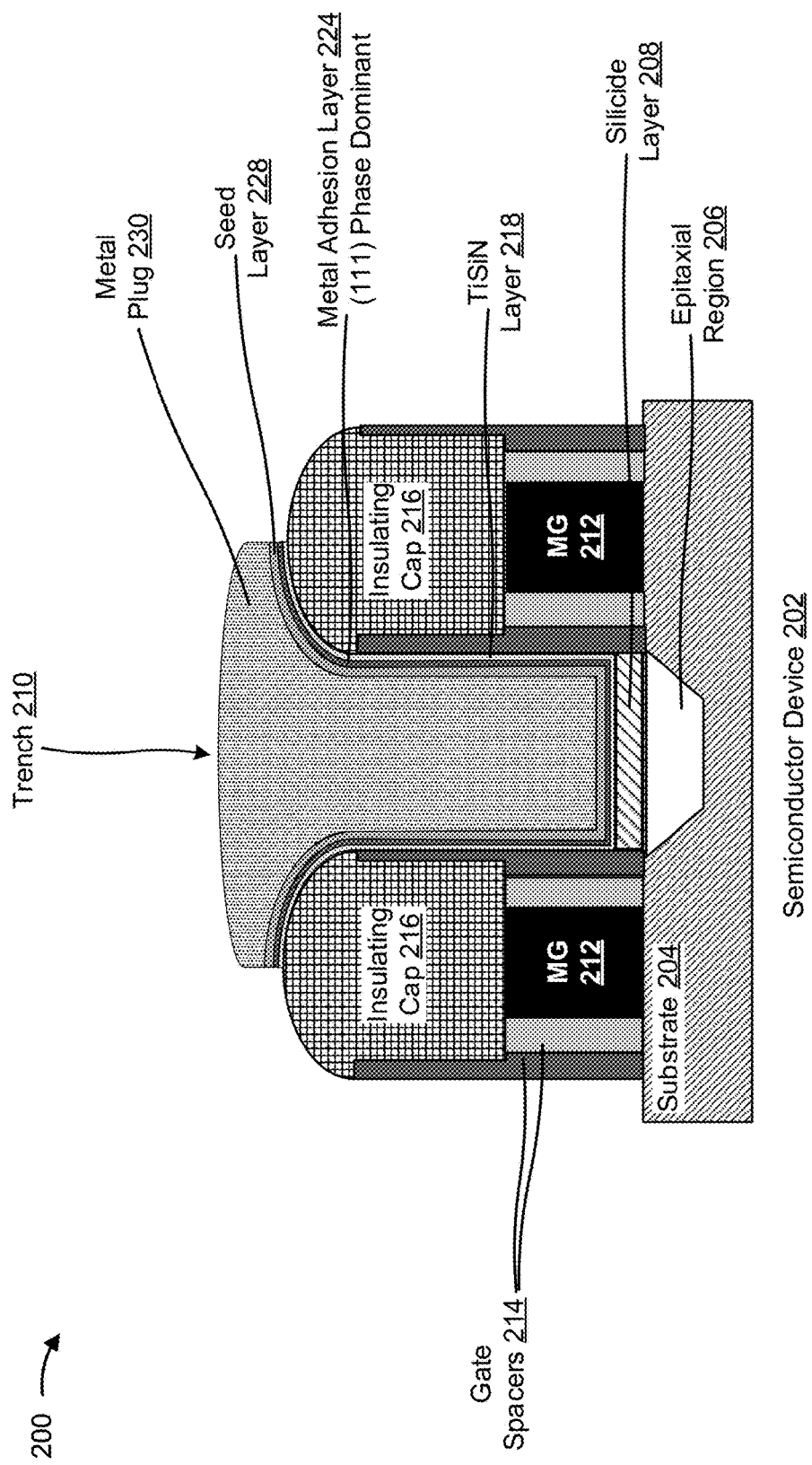

As shown in FIG. 2G, a semiconductor processing tool (e.g., deposition tool 102, plating tool 108, and/or the like) may fill the trench 210 with a metal plug 230. In some implementations, the semiconductor processing tool may deposit material of the metal plug 230 onto the seed layer 228 to form the metal plug 230. The seed layer 228 may promote even deposition, void-free deposition, and may increase adhesion between the metal adhesion layer 224 and the metal plug 230. Examples of materials used for the seed layer 228 and/or the metal plug 230 include titanium, cobalt, tantalum, tungsten, aluminum, hafnium, ruthenium, zirconium, molybdenum, and/or the like.

Figure 2H:
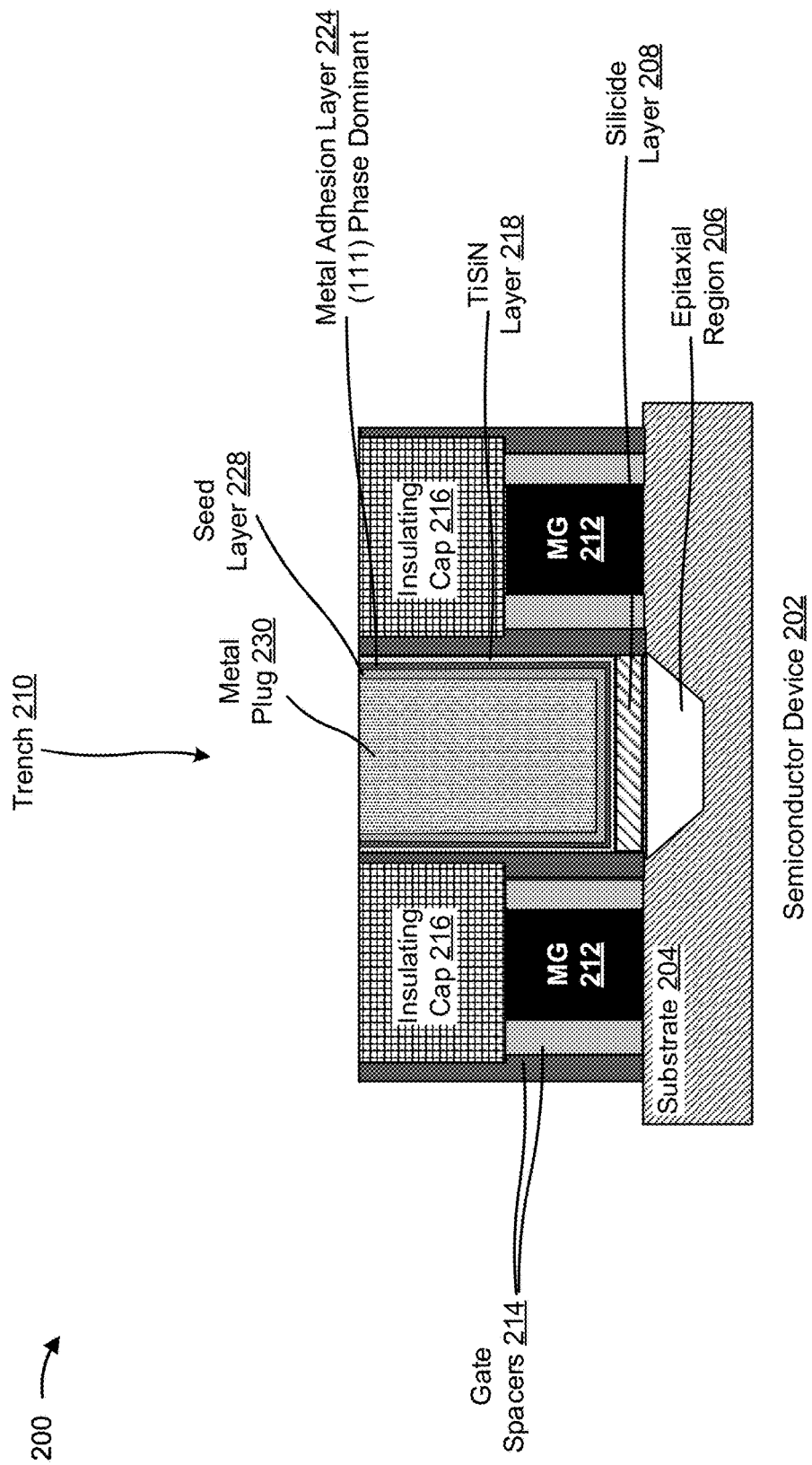

As shown in FIG. 2H, the semiconductor device 202 (or one or more layers or semiconductor structures of the semiconductor device 202) may be planarized or polished. For example, a semiconductor processing tool (e.g., planarization tool 110) may use a CMP technique to flatten or planarize the semiconductor device 202 such that additional layers and/or semiconductor structures may be formed thereon.

The number and arrangement of structures, layers, and/or the like shown in FIGS. 2A-2H are provided as an example. In practice, a semiconductor device including additional structures and/or layers, fewer structures and/or layers, different structures and/or layers, or differently arranged structures and/or layers than those shown in FIGS. 2A-2H may be processed according to the techniques described above in connection with FIGS. 2A-2H.

Figure 3:
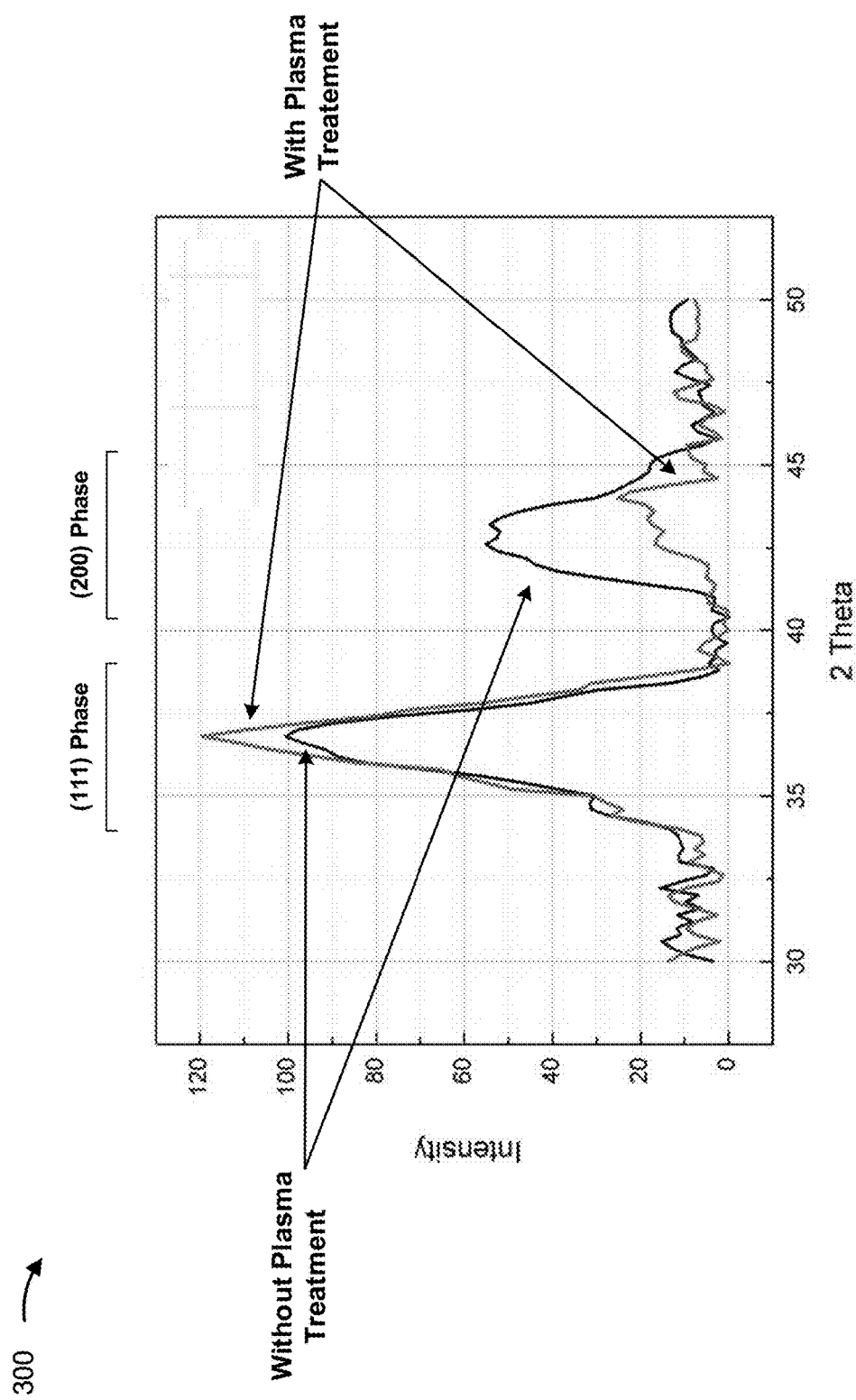
FIG. 3 is a diagram of an example of phase composition data associated with one or more semiconductor devices described herein.

FIG. 3 is a diagram of an example 300 of phase composition data associated with one or more semiconductor devices described herein. As shown in FIG. 3, example 300 illustrates phase composition data for a semiconductor device that includes a metal plug formed without a plasma-treated metal adhesion layer, and phase composition data for a semiconductor device (e.g., semiconductor device 202) that includes a metal plug (e.g., metal plug 230) formed with a plasma-treated metal adhesion layer (e.g., metal adhesion layer 224). As shown in FIG. 3, the (111) phase is increased (e.g., the intensity of the (111) phase is increased) and the (200) phase is decreased (e.g., the intensity of the (200) phase is decreased) for the of the semiconductor device that includes a metal plug formed with the plasma-treated metal adhesion layer relative to the semiconductor device that includes a metal plug formed without a plasma-treated metal adhesion layer.

As indicated above, FIG. 3 is provided as an example. Other examples may differ from what is described with regard to FIG. 3.

Figure 4:
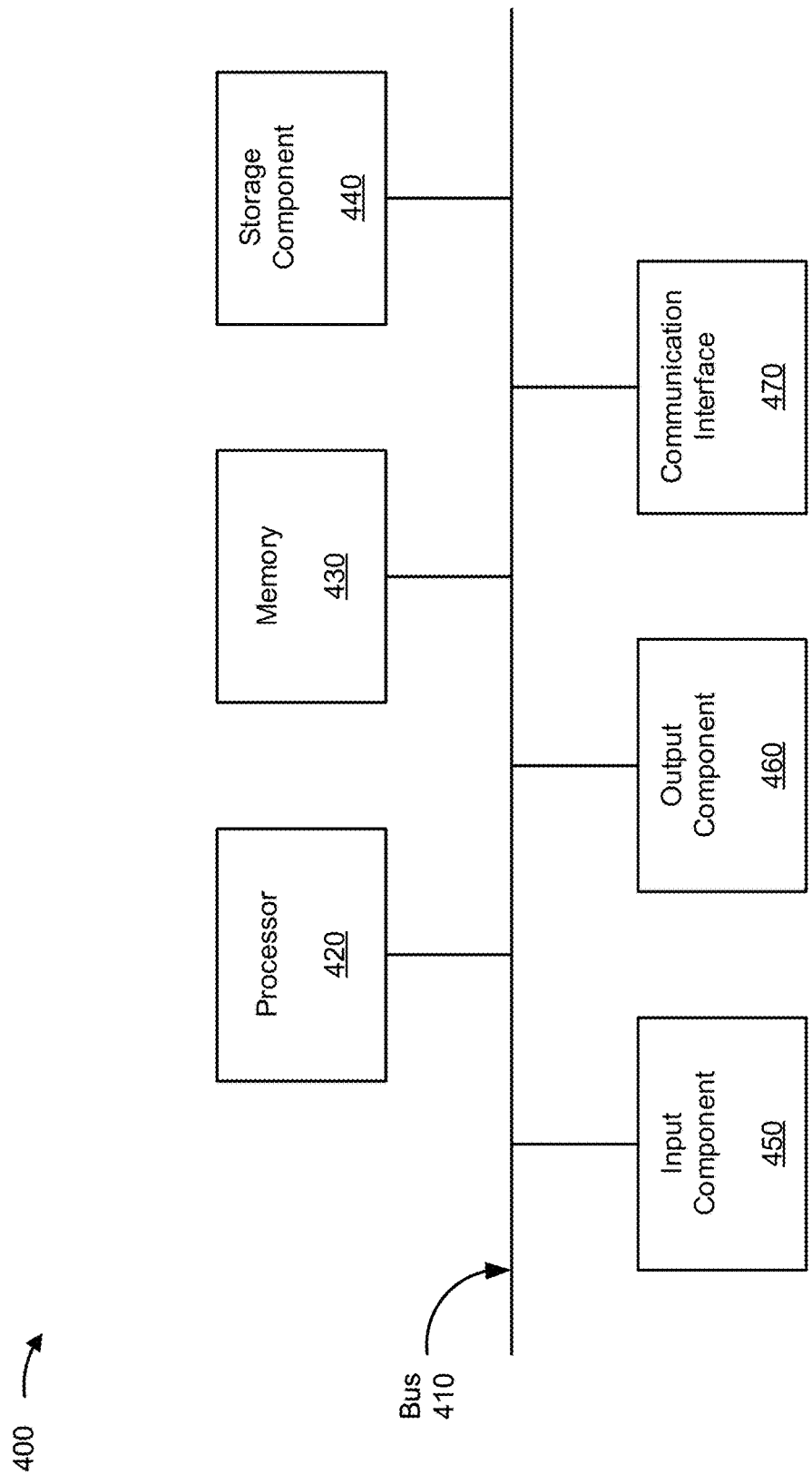
FIG. 4 is a diagram of example components of one or more devices of FIG. 1.

FIG. 4 is a diagram of example components of a device 400. In some implementations, the deposition tool 102, the plasma tool 104, the annealing tool 106, the plating tool 108, the planarization tool 110, and/or the wafer/die transport device 112 may include one or more devices 400 and/or one or more components of device 400. As shown in FIG. 4, device 400 may include a bus 410, a processor 420, a memory 430, a storage component 440, an input component 450, an output component 460, and a communication component 470.

Bus 410 includes a component that enables wired and/or wireless communication among the components of device 400. Processor 420 includes a central processing unit, a graphics processing unit, a microprocessor, a controller, a microcontroller, a digital signal processor, a field-programmable gate array, an application-specific integrated circuit, and/or another type of processing component. Processor 420 is implemented in hardware, firmware, or a combination of hardware and software. In some implementations, processor 420 includes one or more processors capable of being programmed to perform a function. Memory 430 includes a random access memory, a read only memory, and/or another type of memory (e.g., a flash memory, a magnetic memory, and/or an optical memory).

Storage component 440 stores information and/or software related to the operation of device 400. For example, storage component 440 may include a hard disk drive, a magnetic disk drive, an optical disk drive, a solid state disk drive, a compact disc, a digital versatile disc, and/or another type of non-transitory computer-readable medium. Input component 450 enables device 400 to receive input, such as user input and/or sensed inputs. For example, input component 450 may include a touch screen, a keyboard, a keypad, a mouse, a button, a microphone, a switch, a sensor, a global positioning system component, an accelerometer, a gyroscope, an actuator, and/or the like. Output component 460 enables device 400 to provide output, such as via a display, a speaker, and/or one or more light-emitting diodes. Communication component 470 enables device 400 to communicate with other devices, such as via a wired connection and/or a wireless connection. For example, communication component 470 may include a receiver, a transmitter, a transceiver, a modem, a network interface card, an antenna, and/or the like.

Device 400 may perform one or more processes described herein. For example, a non-transitory computer-readable medium (e.g., memory 430 and/or storage component 440) may store a set of instructions (e.g., one or more instructions, code, software code, program code, and/or the like) for execution by processor 420. Processor 420 may execute the set of instructions to perform one or more processes described herein. In some implementations, execution of the set of instructions, by one or more processors 420, causes the one or more processors 420 and/or the device 400 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 4 are provided as an example. Device 400 may include additional components, fewer components, different components, or differently arranged components than those shown in FIG. 4. Additionally, or alternatively, a set of components (e.g., one or more components) of device 400 may perform one or more functions described as being performed by another set of components of device 400.

Figure 5:
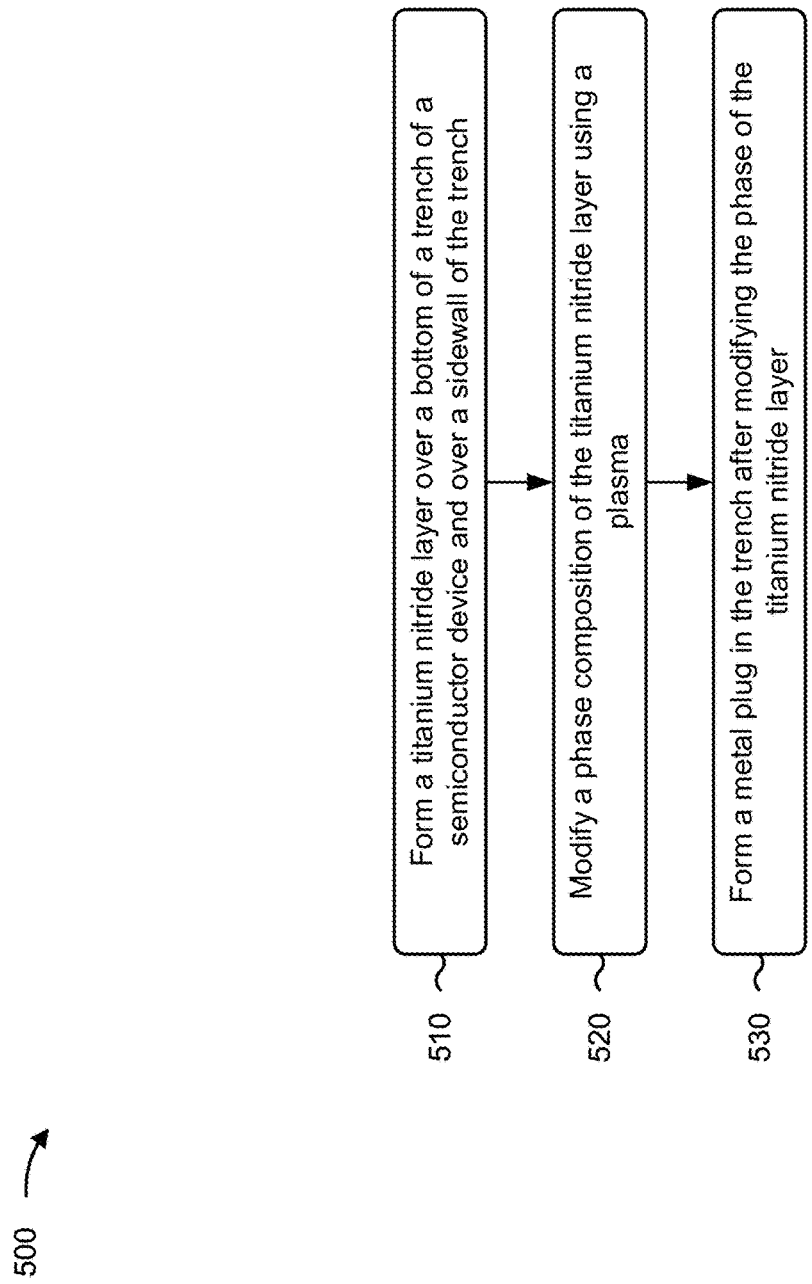
FIGS. 5 and 6 are flowcharts of example processes relating to forming a semiconductor device or a portion thereof.

FIG. 5 is a flowchart of an example process 500 associated with forming a semiconductor device or a portion thereof. In some implementations, one or more process blocks of FIG. 5 may be performed by one or more semiconductor processing tools (e.g., one or more of semiconductor processing tools 102-110 of FIG. 1). Additionally, or alternatively, one or more process blocks of FIG. 5 may be performed by one or more components of device 400, such as processor 420, memory 430, storage component 440, input component 450, output component 460, and/or communication interface 470.

As shown in FIG. 5, process 500 may include forming a titanium nitride layer over a bottom of a trench of a semiconductor device and over a sidewall of the trench (block 510). For example, a semiconductor processing tool (e.g., deposition tool 102) may form a titanium nitride layer (e.g., a metal adhesion layer 224) over a bottom of a trench 210 (e.g., over a silicide layer 208 at the bottom of the trench 210) of a semiconductor device 202 and over a sidewall of the trench 210 (e.g., formed by a plurality of gate spacers 214), as described above.

As further shown in FIG. 5, process 500 may include modifying a phase composition of the titanium nitride layer using a plasma (block 520). For example, a semiconductor processing tool (e.g., plasma tool 104) may modify a phase composition of the titanium nitride layer (e.g., the metal adhesion layer 224) using a plasma, as described above.

As further shown in FIG. 5, process 500 may include forming a metal plug in the trench after modifying the phase composition of the titanium nitride layer (block 530). For example, a semiconductor processing tool (e.g., deposition tool 102, plating tool 108, and/or the like) may form a metal plug 230 in the trench 210 after modifying the phase composition of the titanium nitride layer (e.g., the metal adhesion layer 224), as described above.

Process 500 may include additional implementations, such as any single implementation or any combination of implementations described below and/or in connection with one or more other processes described elsewhere herein.

In a first implementation, modifying the phase composition of the titanium nitride layer increases adhesion between the titanium nitride layer and the metal plug. In a second implementation, alone or in combination with the first implementation, modifying the phase composition of the titanium nitride layer includes causing the phase composition of the titanium nitride layer to transition to a (111) dominant phase. In a third implementation, alone or in combination with one or more of the first and second implementations, modifying the phase composition of the titanium nitride layer includes using nitrogen ions in the plasma to increase a (111) phase of the titanium nitride layer.

In a fourth implementation, alone or in combination with one or more of the first through third implementations, process 500 includes forming a titanium silicon nitride layer (e.g., TiSiN layer 218) over the bottom of the trench and over the sidewall of the trench, and wherein forming the titanium nitride layer includes forming the titanium nitride layer on the titanium silicon nitride layer. In a fifth implementation, alone or in combination with one or more of the first through fourth implementations, modifying the phase composition of the titanium nitride layer using the plasma increases uniformity of nucleation of the titanium nitride layer on the titanium silicon nitride layer.

In a sixth implementation, alone or in combination with one or more of the first through fifth implementations, process 500 includes pretreating the titanium silicon nitride layer with a tetrakis(dimethylamino)titanium (TDMAT) precursor (e.g., precursor 220) prior to forming the titanium nitride layer. In a seventh implementation, alone or in combination with one or more of the first through sixth implementations, forming the metal plug includes forming a seed layer 228 on the titanium nitride layer, and forming the metal plug on the seed layer.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 6:
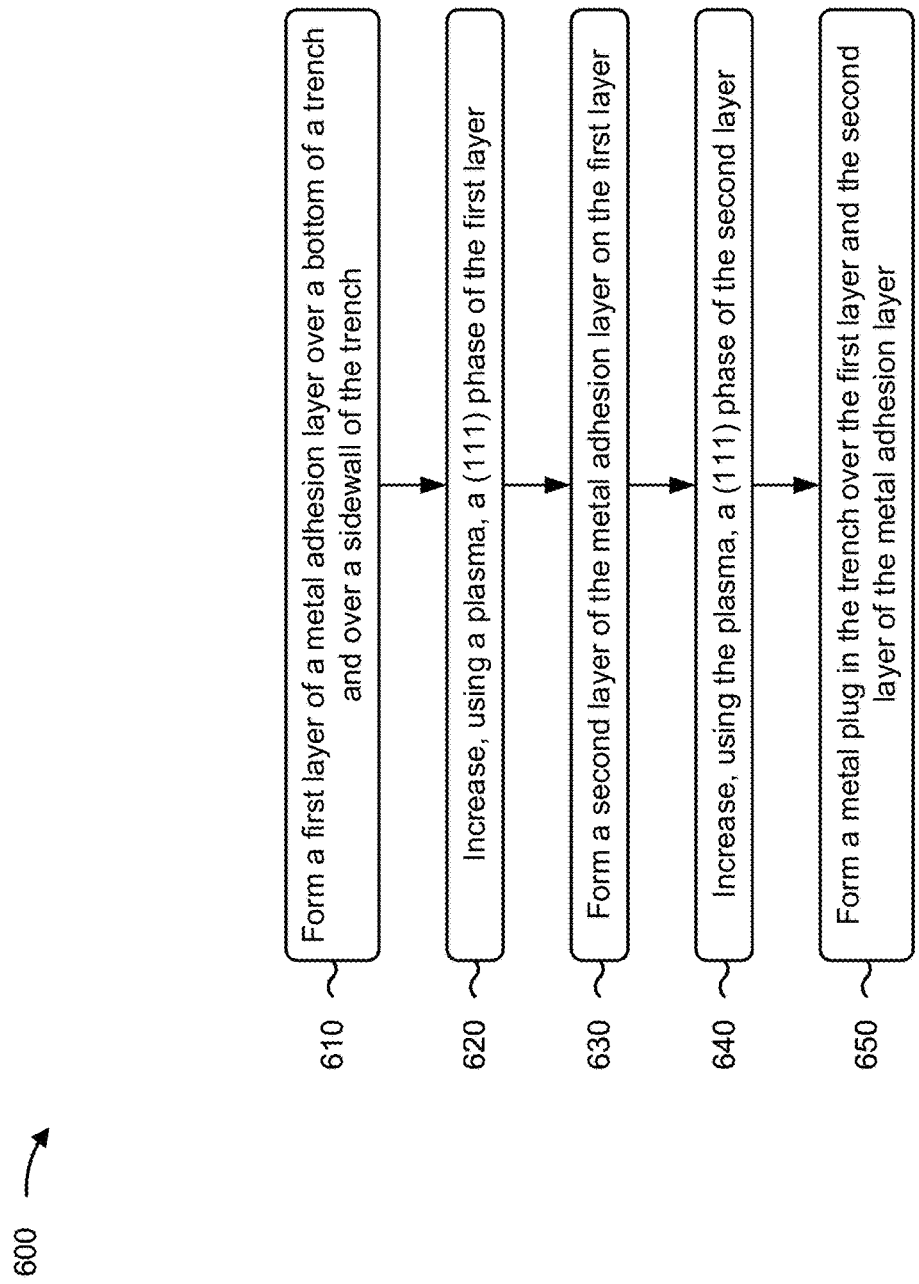

FIG. 6 is a flowchart of an example process 600 associated with forming a semiconductor device or a portion thereof. In some implementations, one or more process blocks of FIG. 6 may be performed by one or more semiconductor processing tools (e.g., one or more of semiconductor processing tools 102-110 of FIG. 1). Additionally, or alternatively, one or more process blocks of FIG. 6 may be performed by one or more components of device 400, such as processor 420, memory 430, storage component 440, input component 450, output component 460, and/or communication interface 470.

As shown in FIG. 6, process 600 may include forming a first layer of a metal adhesion layer over a bottom of a trench and over a sidewall of the trench (block 610). For example, a semiconductor processing tool (e.g., deposition tool 102) may form a first layer of a metal adhesion layer 224 over a bottom of a trench 210 (e.g., over a silicide layer 208 at the bottom of the trench 210) and over a sidewall of the trench 210 (e.g., formed by a plurality of gate spacers 214), as described above.

As further shown in FIG. 6, process 600 may include increasing, using a plasma, a (111) phase of the first layer (block 620). For example, a semiconductor processing tool (e.g., plasma tool 104) may increase, using a plasma, a (111) phase of the first layer, as described above.

As further shown in FIG. 6, process 600 may include forming a second layer of the metal adhesion layer on the first layer (block 630). For example, a semiconductor processing tool (e.g., deposition tool 102) may form a second layer of the metal adhesion layer 224 on the first layer, as described above.

As further shown in FIG. 6, process 600 may include increasing, using the plasma, a (111) phase of the second layer (block 640). For example, a semiconductor processing tool (e.g., plasma tool 104) may increase, using the plasma, a (111) phase of the second layer, as described above.

As further shown in FIG. 6, process 600 may include forming a metal plug in the trench over the first layer and the second layer of the metal adhesion layer (block 650). For example, a semiconductor processing tool (e.g., deposition tool 102, plating tool 108, and/or the like) may form a metal plug 230, in the trench 210 over the first layer and the second layer of the metal adhesion layer 224, as described above.

Process 600 may include additional implementations, such as any single implementation or any combination of implementations described below and/or in connection with one or more other processes described elsewhere herein.

In a first implementation, process 600 includes forming a titanium silicon nitride layer (e.g., TiSiN layer 218) over the bottom of the trench and over the sidewall of the trench, and wherein forming the first layer of the metal adhesion layer includes forming the first layer of the metal adhesion layer on the titanium silicon nitride layer. In a second implementation, alone or in combination with the first implementation, process 600 includes pretreating the titanium silicon nitride layer with a precursor 220 prior to forming the first layer and the second layer of the metal adhesion layer.

In a third implementation, alone or in combination with one or more of the first and second implementations, a ratio of the (111) phase of the first layer to a (200) phase of the first layer is within a range from approximately 3:1 to approximately 6:1. In a fourth implementation, alone or in combination with one or more of the first through third implementations, the metal adhesion layer includes titanium nitride, tantalum nitride, tungsten nitride, ruthenium, or ruthenium cobalt. In a fifth implementation, alone or in combination with one or more of the first through fourth implementations, process 600 includes forming the metal plug on a seed layer 228, wherein the metal plug and the seed layer each includes titanium, cobalt, tantalum, tungsten, aluminum, hafnium, ruthenium, zirconium, or molybdenum.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

As described above, de-wetting for a metal plug may be reduced by forming a metal adhesion layer on a bottom and a sidewall of a trench prior to formation of the metal plug in the trench. A nitrogen-based plasma may be used to modify the phase composition of the metal adhesion layer to increase adhesion between the metal adhesion layer and the metal plug. In particular, the nitrogen-based plasma may cause a shift or transformation of the phase composition of the metal adhesion layer from being roughly equally composed of a (111) phase and a (200) phase (or from having less of a (111) phase component than a (200) phase component) to being composed of a (111) dominant phase. The (111) dominant phase of the metal adhesion layer increases adhesion between the metal adhesion layer and the metal plug in that the (111) dominant phase provides a finer-grained micro structure and a higher interfacial nitrogen density, which provides a greater quantity of nitrogen atoms to which the metal plug may bond.

As described in greater detail above, some implementations described herein provide a method. The method includes forming a titanium nitride layer over a bottom of a trench of a semiconductor device and over a sidewall of the trench. The method includes modifying a phase composition of the titanium nitride layer using a plasma. The method includes forming a metal plug in the trench after modifying the phase composition of the titanium nitride layer.

As described in greater detail above, some implementations described herein provide a device. The device includes a first metal gate, a second metal gate, a trench between the first metal gate and the second metal gate, a silicide layer at a bottom of the trench, an epitaxial region below the silicide layer, a titanium nitride layer over the silicide layer and over a sidewall of the trench, and a metal plug over the titanium nitride layer in the trench. The titanium nitride layer has a (111) dominant phase.

As described in greater detail above, some implementations described herein provide a method. The method includes forming a first layer of a metal adhesion layer over a bottom of a trench and over a sidewall of the trench. The method includes increasing, using a plasma, a (111) phase of the first layer. The method includes forming a second layer of the metal adhesion layer on the first layer. The method includes increasing, using the plasma, a (111) phase of the second layer. The method includes forming a metal plug in the trench over the first layer and the second layer of the metal adhesion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a titanium nitride layer over a bottom of a trench of a semiconductor device and over a sidewall of the trench;
   modifying a phase composition of the titanium nitride layer using a plasma, wherein modifying the phase composition of the titanium nitride layer comprises:
      causing the phase composition of the titanium nitride layer to transition from being equally composed of a (111) phase and a (200) phase, or from being composed of less of the (111) phase than the (200) phase, to being composed of greater of the (111) phase than the (200) phase,
         wherein the (111) phase of the titanium nitride layer being greater than the (200) phase of the titanium nitride layer promotes adhesion between the titanium nitride layer and a metal plug; and
   forming the metal plug in the trench after modifying the phase composition of the titanium nitride layer.

2. The method of claim 1, wherein modifying the phase composition of the titanium nitride layer comprises:
   using nitrogen ions in the plasma to increase the (111) phase of the titanium nitride layer.

3. The method of claim 1, further comprising:
   forming a titanium silicon nitride layer over the bottom of the trench and over the sidewall of the trench; and
   wherein forming the titanium nitride layer comprises:

forming the titanium nitride layer on the titanium silicon nitride layer.

4. The method of claim 3, wherein modifying the phase composition of the titanium nitride layer using the plasma increases uniformity of nucleation of the titanium nitride layer on the titanium silicon nitride layer.

5. The method of claim 3, further comprising:
pretreating the titanium silicon nitride layer with a tetrakis (dimethylamino)titanium precursor prior to forming the titanium nitride layer.

6. The method of claim 1, wherein forming the metal plug comprises:
forming a seed layer on the titanium nitride layer; and
forming the metal plug on the seed layer.

7. A method, comprising:
forming a first layer of a metal adhesion layer over a bottom of a trench and over a sidewall of the trench;
increasing, using a plasma, a (111) phase of the first layer;
forming a second layer of the metal adhesion layer on the first layer;
increasing, using the plasma, a (111) phase of the second layer,
wherein the (111) phase of at least one of the first layer or the second layer is increased from being equal to a (200) phase of the at least one of the first layer or second layer, or from being less than the (200) phase of the at least one of the first layer or the second layer, to being greater than the (200) phase of the at least one of the first layer or the second layer,
wherein the (111) phase of the at least one of the first layer or the second layer being greater than the (200) phase of the at least one of the first layer or the second layer promote adhesion between the metal adhesion layer and a metal plug; and
forming the metal plug in the trench over the first layer and the second layer of the metal adhesion layer.

8. The method of claim 7, further comprising:
forming a titanium silicon nitride layer over the bottom of the trench and over the sidewall of the trench; and
wherein forming the first layer of the metal adhesion layer comprises:
forming the first layer of the metal adhesion layer on the titanium silicon nitride layer.

9. The method of claim 8, further comprising:
pretreating the titanium silicon nitride layer with a precursor prior to forming the first layer and the second layer of the metal adhesion layer.

10. The method of claim 7, wherein a ratio of the (111) phase of the first layer to a (200) phase of the first layer is within a range from approximately 3:1 to approximately 6:1.

11. The method of claim 7, wherein the metal adhesion layer comprises: titanium nitride, tantalum nitride, tungsten nitride, ruthenium, or ruthenium cobalt.

12. The method of claim 7, further comprising:
forming a seed layer on the metal adhesion layer; and
wherein forming the metal plug comprises:
forming the metal plug on the seed layer,
wherein the metal plug and the seed layer each comprises: titanium, cobalt, tantalum, tungsten, aluminum, hafnium, ruthenium, zirconium, or molybdenum.

13. A method, comprising:
forming a titanium nitride layer over a bottom of a trench of a semiconductor device and over a sidewall of the trench;
causing a phase composition of the titanium nitride layer to transition to a ratio of a (111) phase to a (200) phase within a range of approximately 3:1 to approximately 6:1; and
forming a metal plug in the trench after modifying the phase composition of the titanium nitride layer.

14. The method of claim 13, wherein causing the phase composition of the titanium nitride layer to transition increases adhesion between the titanium nitride layer and the metal plug.

15. The method of claim 13, wherein causing the phase composition of the titanium nitride layer to transition comprises:
using nitrogen ions in a plasma to increase the (111) phase of the titanium nitride layer.

16. The method of claim 13, further comprising:
forming a titanium silicon nitride layer over the bottom of the trench and over the sidewall of the trench; and
wherein forming the titanium nitride layer comprises:
forming the titanium nitride layer on the titanium silicon nitride layer.

17. The method of claim 16, wherein modifying the phase composition of the titanium nitride layer using a plasma increases uniformity of nucleation of the titanium nitride layer on the titanium silicon nitride layer.

18. The method of claim 16, further comprising:
pretreating the titanium silicon nitride layer with a tetrakis (dimethylamino)titanium precursor prior to forming the titanium nitride layer.

19. The method of claim 13, wherein forming the metal plug comprises:
forming a seed layer on the titanium nitride layer; and
forming the metal plug on the seed layer.

20. The method of claim 1, further comprising:
planarizing or polishing the titanium nitride layer and the metal plug.

21. The method of claim 7, further comprising:
planarizing or polishing the first layer and the second layer of the metal adhesion layer.

* * * * *